United States Patent
Hori et al.

(10) Patent No.: US 8,188,738 B2
(45) Date of Patent: May 29, 2012

(54) MAGNETIC RESONANCE IMAGING APPARATUS AND RECEIVING-PATH SWITCHING METHOD

(75) Inventors: Masashi Hori, Nasushiobara (JP); Akio Mori, Otawara (JP); Mitsuo Takagi, Otawara (JP)

(73) Assignees: Kabushiki Kaisha Toshiba, Minato-Ku, Tokyo (JP); Toshiba Medical Systems Corporation, Otawara-Shi, Tochigi-Ken (JP)

( * ) Notice: Subject to any disclaimer, the term of this patent is extended or adjusted under 35 U.S.C. 154(b) by 215 days.

(21) Appl. No.: 12/496,056

(22) Filed: Jul. 1, 2009

(65) Prior Publication Data

US 2010/0001726 A1   Jan. 7, 2010

(30) Foreign Application Priority Data

Jul. 1, 2008   (JP) ................ 2008-172753
May 18, 2009   (JP) ................ 2009-120292

(51) Int. Cl.
*G01V 3/00* (2006.01)

(52) U.S. Cl. ................ 324/318; 324/322

(58) Field of Classification Search .......... 324/300–322; 600/407–445; 702/66
See application file for complete search history.

(56) References Cited

U.S. PATENT DOCUMENTS

| | | | |
|---|---|---|---|
| 5,206,593 A * | 4/1993 | Kurihara et al. | 324/312 |
| 5,216,367 A | 6/1993 | Mori | |
| 5,461,314 A | 10/1995 | Arakawa et al. | |
| 5,519,320 A * | 5/1996 | Kanayama et al. | 324/309 |
| 6,946,836 B2 | 9/2005 | Kuhara | |
| 2002/0084782 A1* | 7/2002 | Guthrie | 324/307 |
| 2010/0271022 A1* | 10/2010 | Mitsui et al. | 324/309 |
| 2011/0018539 A1* | 1/2011 | Viswanathan | 324/318 |

FOREIGN PATENT DOCUMENTS

| | | |
|---|---|---|
| JP | 2005-237702 | 9/2005 |
| JP | 2005-237703 | 9/2005 |

* cited by examiner

*Primary Examiner* — Brij Shrivastav
(74) *Attorney, Agent, or Firm* — Nixon & Vanderhye PC

(57) ABSTRACT

In a magnetic resonance imaging apparatus, an event generating substrate included in a sequence control unit generates an event code to make an instruction for switching a receiving path during a scan based on scanning conditions that are set in advance of the scan. When the event code is generated, a radio-frequency switch-matrix substrate of a gantry unit switches the receiving path that connects a receiving coil and a receiving circuit.

14 Claims, 10 Drawing Sheets

| EVENT CODE | SETTING DATA | |
|---|---|---|
| 0001 | RECEIVING-PATH INFORMATION 1 | PIN-DIODE INFORMATION 1 |
| 0010 | RECEIVING-PATH INFORMATION 2 | PIN-DIODE INFORMATION 2 |
| ⋮ | ⋮ | ⋮ |
| 1110 | RECEIVING-PATH INFORMATION N | PIN-DIODE INFORMATION N |
| 1111 | PRIOR-PATH SWITCHING SIGNAL | |

MAGNETIC RESONANCE IMAGING APPARATUS AND RECEIVING-PATH SWITCHING METHOD

CROSS-REFERENCE TO RELATED APPLICATIONS

This application is based upon and claims the benefit of priority from the prior Japanese Patent Application No. 2008-172753, filed on Jul. 1, 2008, and No. 2009-120292, filed on May 18, 2009; the entire contents of which are incorporated herein by reference.

BACKGROUND OF THE INVENTION

1. Field of the Invention

The present invention relates to a magnetic resonance imaging apparatus that irradiates a subject placed in a static magnetic field with a radio-frequency magnetic field, detects a nuclear magnetic resonance signal emitted from the subject with a receiving coil, and reconstructs an image; and a receiving-path switching method.

2. Description of the Related Art

A Magnetic Resonance Imaging (MRI) apparatus is an apparatus that irradiates a subject placed in a static magnetic field with a Radio Frequency (RF) magnetic field, detects a Nuclear Magnetic Resonance (NMR) signal emitted from the subject owing to the irradiated radio-frequency field, and reconstructs an image.

Such MRI apparatus uses a receiving coil for receiving an NMR signal. There are various kinds of coils used for the receiving coil, such as a Whole Body (WB) coil, and a Phased Array (PA) coil that includes a plurality of surface coils (hereinafter, referred to as "coil element"), and an appropriate one is to be selected in accordance with a type of a scan.

Among imaging methods used by MRI apparatuses, there is a method of using a plurality of kinds of receiving coils. For example, according to parallel imaging that achieves a fast scan by receiving and processing signals in parallel by using a PA coil, a sensitivity prescan for creating a sensitivity map that indicates a sensitivity distribution of each coil element is performed prior to a main scan. A WB coil and a PA coil are used in the sensitivity prescan.

Specifically, in the sensitivity prescan, scanning is performed first by using the WB coil, and a WB-coil image is reconstructed based on an NMR signal received by the WB coil. Scanning is then performed by using the PA coil, and a PA-coil image is reconstructed from an NMR signal received by the PA coil. A sensitivity distribution of each coil element is then estimated by comparing the WB-coil image and the PA-coil image, and a sensitivity map is created (for example, see JP-A 2005-237702 (KOKAI), or JP-A 2005-237703 (KOKAI)).

In this way, conventionally, to perform a scan by using a plurality of kinds of receiving coils, scanning needs to be performed with each receiving coil, and a receiving path connecting a receiving coil and a receiving circuit (circuit that processes an NMR signal received by the receiving coil) needs to be switched scan by scan. For example, in a sensitivity prescan of parallel imaging, to begin with, the receiving path is set between the WB coil and the receiving circuit, and scanning for the first time is performed; and then after the receiving path is switched to a path between the PA coil and the receiving circuit, scanning for the second time is performed.

However, conventionally, because setting of the receiving path described above is performed scan by scan based on coil information selected by the operator, the subject sometimes may move while setting the receiving path in some cases. If the subject moves while setting the receiving path, there is a possibility of occurrence of misregistration (positional disagreement) among images each of which is reconstructed scan by scan, as a result, sometimes correct image cannot be obtained in some cases.

For example, according to a sensitivity scan of parallel imaging, when misregistration have occurred between a PA-coil image and a WB-coil image, a sensitivity distribution cannot be correctly estimated, resulting in a substantial influence on the accuracy of a sensitivity map.

To reduce such misregistration of images caused by a motion of the subject, it has only to switch the receiving path during a scan, instead of switching the receiving path scan by scan. Accordingly, it can reduce a time of a period having a possibility that the subject may move.

SUMMARY OF THE INVENTION

According to one aspect of the present invention, a magnetic resonance imaging apparatus includes a radio-frequency magnetic-field irradiating unit that irradiates a subject placed in a static magnetic field with a radio-frequency magnetic field; a receiving coil that detects a nuclear magnetic resonance signal emitted from the subject caused by the radio-frequency magnetic field irradiated by the radio-frequency magnetic-field irradiating unit; an image reconstructing unit that reconstructs an image from the nuclear magnetic resonance signal detected by the receiving coil; an event generating unit that generates an event code to make an instruction for switching a receiving path that connects a receiving coil and a receiving circuit during a scan based on scanning conditions set in advance of the scan; a receiving-path switching unit that switches a receiving path that connects the receiving coil and the receiving circuit when the event generated unit generates the event code.

According to another aspect of the present invention, a magnetic resonance imaging apparatus includes a radio-frequency magnetic-field irradiating unit that irradiates a subject placed in a static magnetic field with a radio-frequency magnetic field; a plurality of receiving coils that detects a nuclear magnetic resonance signal emitted from the subject caused by the radio-frequency magnetic field irradiated by the radio-frequency magnetic-field irradiating unit; an image reconstructing unit that reconstructs an image from the nuclear magnetic resonance signal detected by the receiving coils; and a receiving-path switching unit that switches receiving paths that connect the receiving coils and a receiving circuit during a scan based on scanning conditions set in advance of the scan.

According to still another aspect of the present invention, a receiving-path switching method includes generating an event code to make an instruction for switching a receiving path that connects a receiving coil and a receiving circuit during a scan performed by a magnetic resonance imaging apparatus based on scanning conditions set in advance of the scan, and switching the receiving path that connects the receiving coil and the receiving circuit when the event code is generated.

DETAILED DESCRIPTION OF THE INVENTION

Exemplary embodiments of a magnetic resonance imaging apparatus and a receiving-path switching method according to the present invention will be explained below in detail with reference to the accompanying drawings. The embodiments described below are explained mainly about switching of receiving paths for connection to a Phased Array (PA) coil and a Whole Body (WB) coil, assuming a case of performing a sensitivity prescan of parallel imaging.

Figure 1:
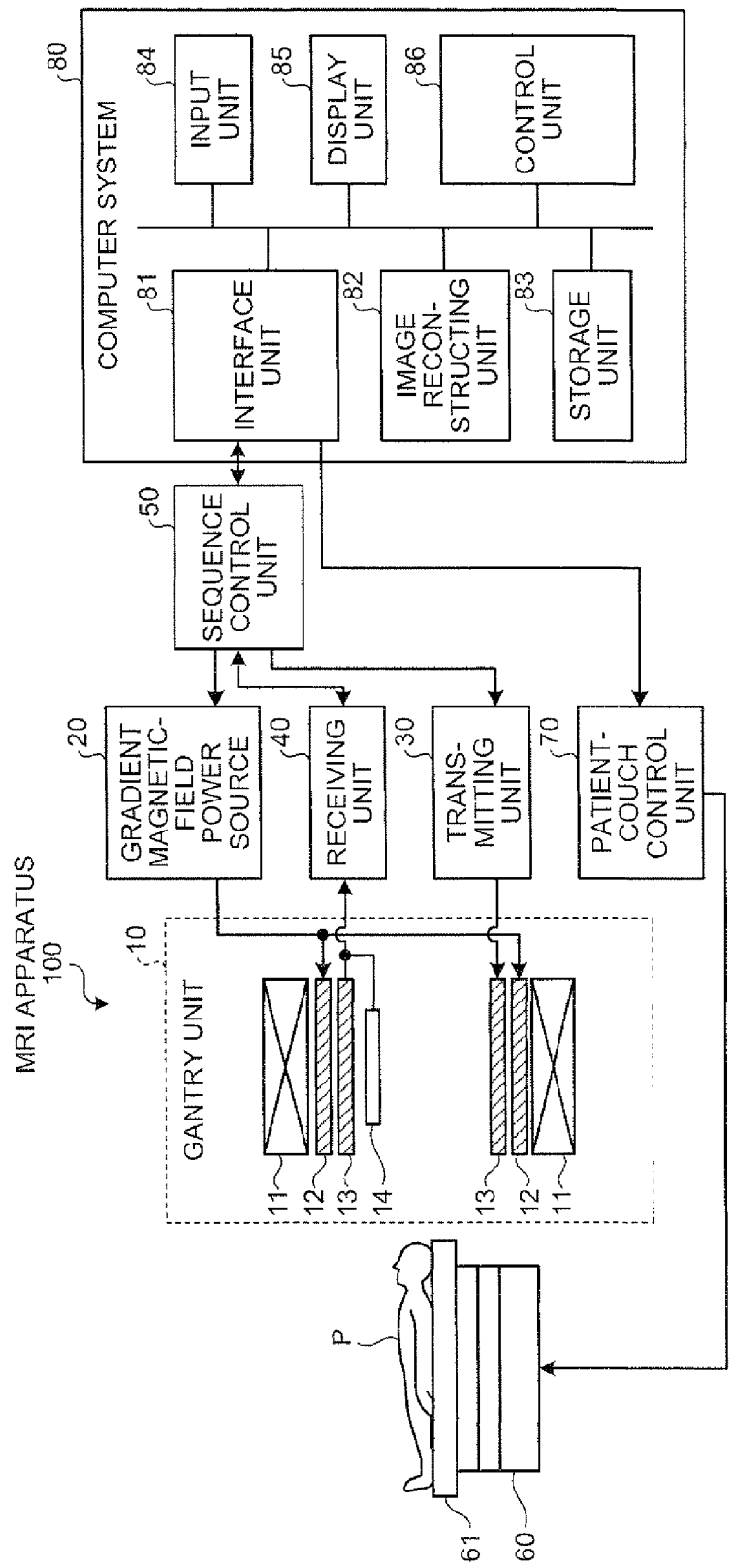
FIG. 1 is a schematic diagram of a Magnetic Resonance Imaging (MRI) apparatus according to an embodiment the present invention.

First of all, a configuration of a Magnetic Resonance Imaging (MRI) apparatus according to an embodiment of the present invention is explained below with reference to FIG. 1. FIG. 1 is a schematic diagram of an MRI apparatus 100 according to the embodiment. As shown in the figure, the MRI apparatus 100 includes a gantry unit 10, a gradient magnetic-field power source 20, a transmitting unit 30, a receiving unit 40, a sequence control unit 50, a patient couch unit 60, a patient-couch control unit 70, and a computer system 80.

The gantry unit 10 irradiates a subject placed in a static magnetic field with a radio-frequency magnetic field, and detects a Nuclear Magnetic Resonance (NMR) signal emitted from the subject. The gantry unit 10 includes particularly a static magnetic-field magnet 11, a gradient magnetic-field coil 12, a WB coil 13, and a PA coil 14.

The static magnetic-field magnet 11 is formed in a hollow cylindrical shape, and generates a uniform static magnetic field in its inside space. For example, a permanent magnet, or a super conducting magnet is used as the static magnetic-field magnet 11.

The gradient magnetic-field coil 12 is formed in a hollow cylindrical shape, and is arranged inside the static magnetic-field magnet 11. The gradient magnetic-field coil 12 is formed of three coils in combination corresponding to x, y, and z axes orthogonal to one another. The three coils generate gradient magnetic fields of which field strengths vary along three directions of the x, y, and z axes, respectively, by individually receiving a current supply from the gradient magnetic-field power source 20.

The gradient magnetic fields of the x, y, and z axes generated by the gradient magnetic-field coil 12 correspond to, for example, a readout gradient magnetic field Gr, a phase encoding gradient magnetic field Ge, and a slice-selective gradient magnetic field Gs, respectively. The readout gradient magnetic field Gr is used for changing the frequency of an NMR signal in accordance with a spatial position. The phase encoding gradient magnetic field Ge is used for changing the phase of an NMR signal in accordance with a spatial position. The slice-selective gradient magnetic field Gs is used for arbitrarily setting a scan cross section.

The WB coil 13 is arranged inside the gradient magnetic-field coil 12, and generates a radio-frequency magnetic field by receiving supply of a radio-frequency pulse from the transmitting unit 30. The WB coil 13 is also used for receiving an NMR signal emitted from a subject P owing to influence of the generated radio-frequency magnetic field, and transmits the received NMR signal, to the receiving unit 40. Moreover, the WB coil 13 includes a pin diode that is to be a switch for controlling decoupling with another coil.

The PA coil 14 is arranged inside the gradient magnetic-field coil 12, and receives an NMR signal emitted from the subject P owing to influence of the radio-frequency magnetic field generated by the WB coil 13. The PA coil 14 includes a plurality of coil elements, and when each coil element receives an NMR signal, the PA coil 14 transmits the received NMR signal to the receiving unit 40. Moreover, the PA coil 14 includes a pin diode that is to be a switch for controlling decoupling with another coil.

The gradient magnetic-field power source 20 supplies a current to the gradient magnetic-field coil 12.

The transmitting unit 30 includes an oscillating unit, a phase selecting unit, a frequency converting unit, an amplitude modulating unit, a radio-frequency power amplifying unit, and the like; and transmits a radio-frequency pulse corresponding to a Larmor frequency to the WB coil 13 as a result of operation of the above units. The oscillating unit generates a radio-frequency signal of a resonance frequency unique to a subject nucleus in the static magnetic field. The phase selecting unit selects a phase of the radio-frequency signal. The frequency converting unit converts the frequency of the radio-frequency signal output by the phase selecting unit. The amplitude modulating unit modulates the amplitude of the radio-frequency signal output by the frequency converting unit in accordance with, for example, a sine function. The radio-frequency power amplifying unit amplifies the radio-frequency signal output by the amplitude modulating unit.

The receiving unit 40 performs amplification, phase detection, and digital conversion on an NMR signal transmitted from the WB coil 13 and the PA coil 14, creates raw data, and transmits the created raw data to the sequence control unit 50.

The sequence control unit 50 performs a scan of the subject P by driving the gradient magnetic-field power source 20, the transmitting unit 30, and the receiving unit 40, based on sequence information transmitted from the computer system 80. The sequence information is information that defines a procedure for performing a scan, for example, the strength of power that the gradient magnetic-field power source 20 supplies to the gradient magnetic-field coil 12 and a timing of supplying the power, the strength of a radio-frequency pulse that the transmitting unit 30 transmits to the WB coil 13 and a timing of transmitting the radio-frequency pulse, and a timing with which the receiving unit 40 detects an NMR signal.

When raw data is transmitted from the receiving unit 40 as a result of performing a scan of the subject P by driving the gradient magnetic-field power source 20, the transmitting unit 30, and the receiving unit 40, the sequence control unit 50 transfers the raw data to the computer system 80.

The patient couch unit 60 includes a top plate 61 on which the subject P is to be placed; and under the control of the patient-couch control unit 70, the patient couch unit 60 inserts the top plate 61 on which the subject P is placed, into a hole (a scanning space) of the gradient magnetic-field coil 12. Usually, the patient couch unit 60 is placed such that its longitudinal direction is to be parallel to the central axis of the static magnetic-field magnet 11.

The patient-couch control unit 70 controls the patient couch unit 60, and moves the top plate 61 in the longitudinal direction and upward and downward by driving the patient couch unit 60.

The computer system 80 performs overall control of the MRI apparatus 100, data collection, image reconstruction, and the like; and includes an interface unit 81, an image reconstructing unit 82, a storage unit 83, an input unit 84, a display unit 85, and a control unit 86.

The interface unit 81 controls input and output of various signals that are given to and received from the sequence control unit 50. For example, the interface unit 81 transmits sequence information to the sequence control unit 50, and receives raw data from the sequence control unit 50.

The raw data received by the interface unit 81 is stored into the storage unit 83 as k-space data associated with information about a spatial frequency in a Phase Encoding (PE) direction, a readout (RO) direction, and a Spin Echo (SE) direction according to the slice-selective gradient magnetic field. Gs, the phase encoding gradient magnetic field Ge, and the readout gradient magnetic field Gr.

The image reconstructing unit 82 creates spectrum data or image data of a desired nuclear spin inside the subject P by performing post-processing, i.e., reconstruction processing, such as a Fourier transform, on raw data stored by the storage unit 83 as k-space data.

The storage unit 83 stores raw data received by the interface unit 81, image data created by the image reconstructing unit 82, and the like, with respect to each subject P.

The input unit 84 receives various instructions and information input from an operator. A pointing device, such as a mouse or a trackball, a selecting device, such as a mode switch, and an input device, such as a keyboard, can be used as required, as the input unit 84.

The display unit 85 displays various information, such as spectrum data or image data, under the control of the control unit 86. A display device, such as a liquid crystal display, can be used as the display unit 85.

The control unit 86 includes a Central Processing Unit (CPU) and a memory, and controls the MRI apparatus 100 overall. Specifically, the control unit 86 controls a scan by creating sequence information based on scanning conditions input from the operator via the input unit 84, and transmitting the created sequence information to the sequence control unit 50, and controls reconstruction of an image to be performed based on k-space data sent from the sequence control unit 50 as a result of the scan.

Moreover, the control unit 86 includes a function of creating a sensitivity map in parallel imaging. Specifically, when performing a sensitivity prescan of parallel imaging, the control unit 86 creates sequence information about a sequence of continuously performing scanning by using a PA coil as a receiving coil and scanning by using a WB coil, based on scanning conditions input from the operator.

As a result of having performed the sensitivity prescan, when a PA-coil image based on the NMR signal received by the PA coil 14 and a WB-coil image based on the NMR signal received by the WB coil 13 are then reconstructed, the control unit 86 compares the both images, thereby estimating a sensitivity distribution of each coil element included in the PA coil 14 and creating a sensitivity map. One of various methods that are generally known is used as a creating method of such sensitivity map.

A general configuration of the MRI apparatus according to the embodiment is explained above. Under such configuration, according to the embodiment, the sequence control unit 50 generates an event code to make an instruction for switching the receiving path during a scan, based on scanning conditions set in advance of the scan; and when an event code is generated, the gantry unit 10 switches the receiving path that connects the WB coil 13 or the PA coil 14 to the receiving circuit that the receiving unit 40 includes.

Switching of the receiving path performed by the gantry unit 10, the receiving unit 40, and the sequence control unit 50 is explained below in detail with reference to FIGS. 2 to 7.

Figure 2:
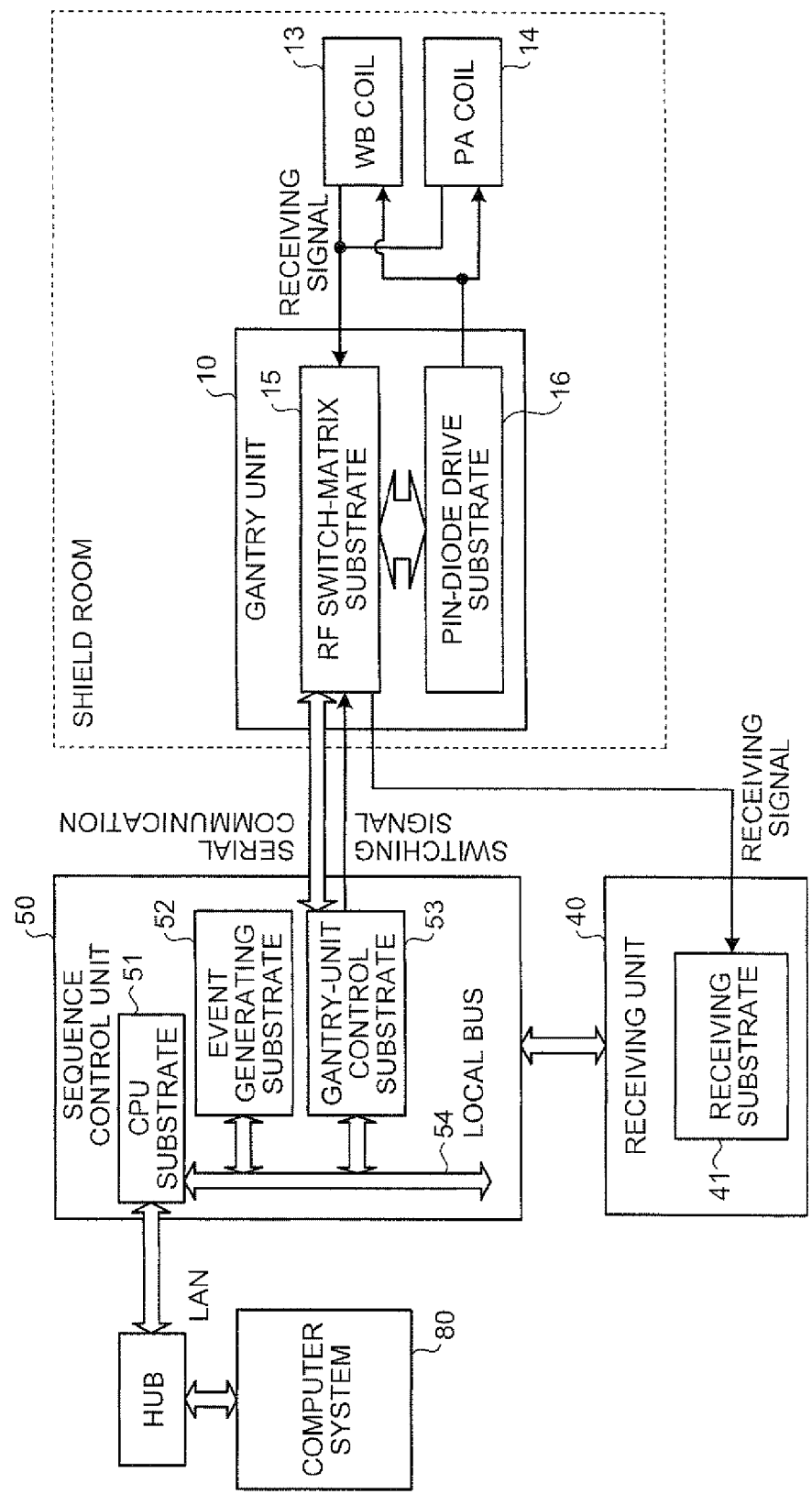
FIG. 2 is a functional block diagram of a gantry unit, a receiving unit, and a sequence control unit shown in FIG. 1.

At first, a configuration of the gantry unit 10, the receiving unit 40, and the sequence control unit 50 is explained below with reference to FIG. 2. FIG. 2 is a functional block, diagram of the gantry unit 10, the receiving unit 40, and the sequence control unit 50. As shown in the figure, the sequence control unit 50 is connected to the computer system 80, for example, via a hub and a Local Area Network (LAN). Moreover, the gantry unit 10, the WB coil 13, the PA coil 14, and the like are placed inside a shield, room that prevents interference of a radio-frequency (RF) wave from the outside.

The sequence control unit 50 includes particularly a Central Processing Unit (CPU) substrate 51, an event generating substrate 52, and a gantry-unit control substrate 53.

The CPU substrate 51 controls various control substrates that the sequence control unit 50 includes, based on sequence information transmitted from the computer system 80.

The event generating substrate 52 generates an event code during a scan in accordance with a time table in which the type and the timing of an event is set by the CPU substrate 51, and transmits the generated event code to the event generating substrate 52.

The event code generated by the event generating substrate 52 includes an event code to make an instruction for switching the receiving path. Specifically, the event generating substrate 52 generates an event code to make an instruction for switching the receiving path unit by unit of echo collection.

The event code to make an instruction for switching the receiving path includes a prior code that is generated with a certain timing. Specifically, the event generating substrate 52 generates a prior code with a timing of using a receiving coil to be used prior to the other coils (hereinafter, referred to as "prior coil").

The gantry-unit control substrate 53 stores setting data set by the CPU substrate 51 in the storage unit, and transmits setting data stored in the storage unit to the gantry unit 10 through serial communication. Specifically, when an event code to make an instruction for switching the receiving path is transmitted from the event generating substrate 52, the gantry-unit control substrate 53 selects setting data, corresponding to the transmitted event code from among prestored setting data, and transmits the selected setting data to the gantry unit 10.

The setting data includes "receiving-path information" that is required for setting the receiving path, and "pin-diode information" that is information for switching ON/OFF of pin diodes included in the WB coil 13 and the PA coil 14.

Moreover, when a prior code is generated by the event generating substrate 52, the gantry-unit control substrate 53 transmits a prior-path switching signal to the gantry unit 10.

The substrates explained above are connected in a manner capable to communicate with one another via a local bus 54 with an event code bit.

The gantry unit 10 includes particularly an RF switch-matrix substrate 15 and a pin-diode drive substrate 16. The gantry unit 10 is connected to the gantry-unit control substrate 53, for example, through optical communication.

The RF switch-matrix substrate 15 receives setting data through serial communication from the gantry-unit control substrate 53, and changes the receiving path by using receiving-path information included in the received setting data. Accordingly, the RF switch-matrix substrate 15 can select NMR signals transmitted to the receiving unit 40 from the WB coil 13 and the PA coil 14.

Specifically, the RF switch-matrix substrate 15 includes a storage unit for storing setting data transmitted from the gantry-unit control substrate 53, stores varied setting data into the storage unit, thereby setting the receiving path of a pattern corresponding to the setting data. In other words, a plurality of patterns of the receiving path can be set in a variable manner by changing setting data to be stored in the storage unit.

When setting the receiving path between the PA coil 14 and the receiving circuit, the RF switch-matrix substrate 15 can set a receiving path so as to connect the receiving circuit to one coil element, or can set a receiving path so as to connect the receiving circuit to a group of coil elements that is two or more coil elements are combined (considered as one coil element as a whole).

Moreover, the RF switch-matrix substrate 15 receives a prior-path switching signal from the gantry-unit control substrate 53. The RF switch-matrix substrate 15 preliminarily include a receiving path that connects the prior coil and the receiving circuit as "a prior path", apart from a receiving path set in a variable manner in accordance with setting data. When receiving the prior-path switching signal, the RF switch-matrix substrate 15 switches to the prior path from the receiving path, that is set by using setting data.

The pin-diode drive substrate 16 acquires setting data received by the gantry-unit control substrate 53, and controls ON/OFF of pin diodes included in the WB coil 13 and the PA coil 14 based on pin-diode information included in the acquired setting data.

The receiving unit 40 includes a receiving substrate 41. The receiving substrate 41 includes a plurality of receiving circuits, and receives NMR signals from the WB coil 13 and the PA coil 14 via a receiving path set by the RF switch-matrix substrate 15 or the prior path.

Figure 3:
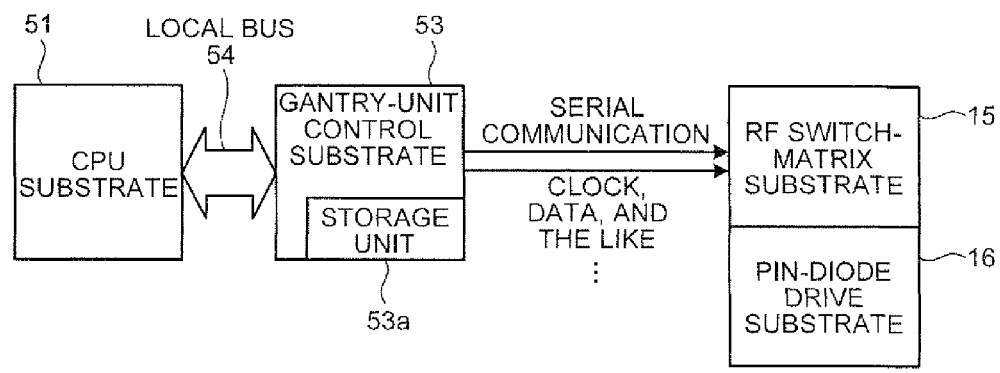
FIG. 3 is a schematic diagram for explaining a receiving-path switching method at a usual scan.

A receiving-path switching method at a usual scan is explained below with reference to FIG. 3. FIG. 3 is a schematic diagram for explaining the receiving-path switching method at a usual scan. The receiving-path switching method explained below is the same as a method that is conventionally used.

As shown in the figure, at a usual scan, the CPU substrate 51 transmits setting data to the gantry-unit control substrate 53 via the local bus 54 based on coil information included in scanning conditions set in advance of the scan (information about a coil selected by a user). When receiving setting data, the gantry-unit control substrate 53 stores the received setting data in a storage unit 53a.

After that, the gantry-unit control substrate 53 transmits the setting data stored in the storage unit 53a to the RF switch-matrix substrate 15 through serial communication in accordance with a transmission command from the CPU substrate 51. The RF switch-matrix substrate 15 then sets a receiving path by using the transmitted setting data.

Figure 4:
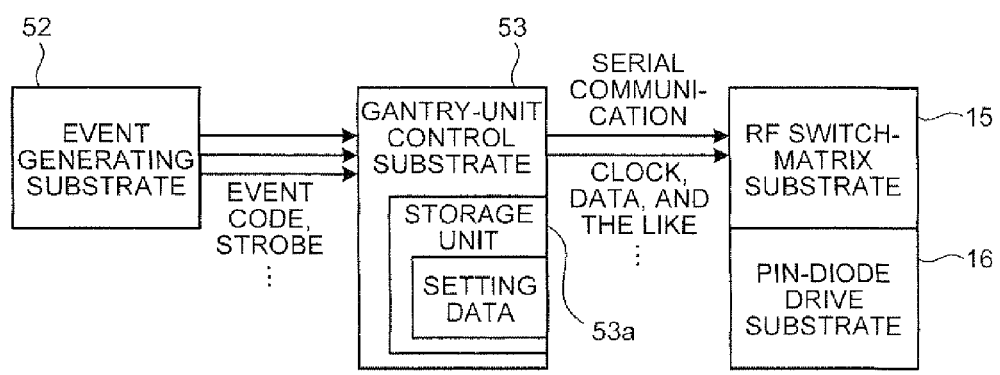
FIG. 4 is a schematic diagram for explaining a receiving-path switching method when switching the receiving path during a scan.

A receiving-path switching method when switching the receiving path during a scan is explained below with reference to FIG. 4. FIG. 4 is a schematic diagram for explaining the receiving-path switching method when switching the receiving path during a scan.

As shown in the figure, when switching the receiving path during a scan, the event generating substrate 52 generates an event code to make an instruction for switching the receiving path at a breakpoint of a unit of echo collection in accordance with a time table set by the CPU substrate 51, and transmits the event code to the gantry-unit control substrate 53.

When receiving the event code, the gantry-unit control substrate 53 selects setting data corresponding to the received event code from among setting data preliminarily stored in the storage unit 53a, and transmits the selected setting data to the gantry unit 10.

Figures 5, 6:
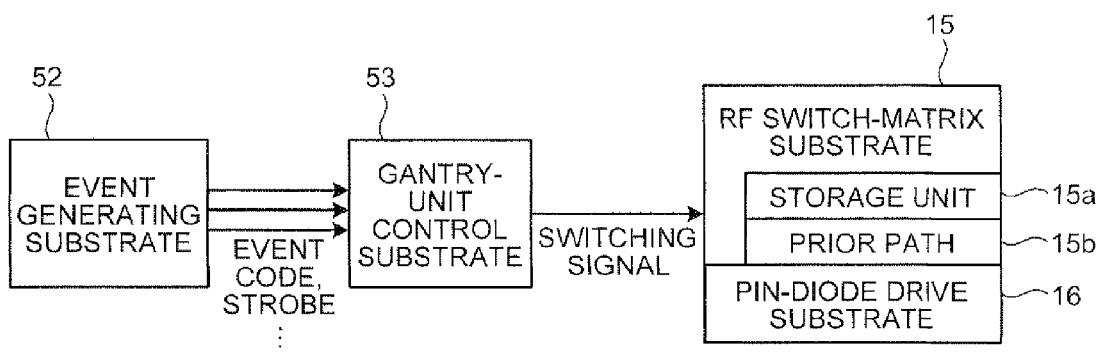
FIG. 5 is a schematic diagram of an example of setting data to be stored by a storage unit of a gantry-unit control substrate shown in FIG. 2.
FIG. 6 is a schematic diagram for explaining a receiving-path switching method when, switching the receiving path to a prior path.

FIG. 5 is a schematic diagram of an example of setting data to be stored by the storage unit 53a of the gantry-unit control substrate 53. For example, as shown in the figure, receiving-path information and pin-diode information are set in setting data by being associated with an event code. According to an example as shown in the figure, setting data is associated with "0001", "0010", "1110", or the like, and stored.

Furthermore, a prior-path switching signal is set in the setting data by being associated with a prior code to be generated by the event generating substrate 52 with a timing of using the prior coil. According to the example as shown in the figure, "1111" is the prior code.

For example, when the event code "0010" is transmitted from the event generating substrate 52, the gantry-unit control substrate 53 transmits setting data that includes receiving-path information 2 and pin-diode information 2 to the gantry unit 10.

When the setting data is transmitted from the gantry-unit control substrate 53, in the gantry unit 10, the RF switch-matrix substrate 15 sets a receiving path by using receiving-path information included in the transmitted setting data. The pin-diode drive substrate 16 switches ON/OFF of a pin diode based on pin-diode information included in the setting data.

It is known that noise appears on a reconstructed image if serial communication is carried out between the event generating substrate 52 and the gantry-unit control substrate 53 while the WB coil 13 is generating a radio-frequency magnetic field, or while the WB coil 13 or the PA coil 14 is receiving an NMR signal. For this reason, transmission of a setting data by the event generating substrate 52 to the gantry-unit control substrate 53 through serial communication is carried out with a timing excepting a period while the WB coil 13 is generating a radio-frequency magnetic field and a period while the WB coil 13 or the PA coil 14 is receiving an NMR signal.

A receiving-path switching method when switching the receiving path to the prior path is explained below with reference to FIG. 6. FIG. 6 is a schematic diagram for explaining the receiving-path switching method when switching the receiving path to the prior path. It is assumed that the WB coil 13 is set as a prior path, and the storage unit 53a of the gantry-unit control substrate 53 stores the setting data shown in FIG. 5.

As shown in the figure, when switching the receiving path to the prior path, the event generating substrate 52 generates the prior code "1111" at a breakpoint of a unit of echo collection, and transmits the generated prior code "1111" to the gantry-unit control substrate 53.

Upon receiving the prior code "1111", the gantry-unit control substrate 53 acquires setting data associated with the prior code "1111" from among the setting data stored by the storage unit 53a. As shown in FIG. 5, because a prior-path switching signal is set in the setting data associated with the prior code "1111", the gantry-unit control substrate 53 transmits the prior-path switching signal to the gantry unit 10.

When the prior-path switching signal is transmitted from the gantry-unit control substrate 53; in the gantry unit 10, the RF switch-matrix substrate 15 cancels the receiving path of the PA coil 14 that is set according to the setting data stored in a storage unit 15a, and sets a prior path 15b that is predetermined, i.e., a receiving path that connects the WB coil 13 as the prior coil to the receiving circuit.

The prior-path switching signal to be used for switching to the prior path explained above is a signal for simply making an instruction for switching, therefore it can be a signal of a few bits. On the other hand, as receiving paths available to be switched are getting more, the setting data requires more bits than the prior-path switching signal.

A recent trend is toward increase in the number of coil elements included in the PA coil 14 and the number of receiving circuits included in the receiving substrate 41 (shift to multichannel) along with development in various scanning methods. As the number of coil elements and the number of receiving circuits increase, the number of patterns of receiving paths available to be set increases, so that the number of bits required for setting data further increases.

If the number of bits of the setting data increases in this way, there is a concern about increase in a communication time when transmitting the setting data to the gantry unit 10 from the gantry-unit control substrate 53 through serial communication. However, according to the switching by using the prior-path switching signal explained above, as the RF switch-matrix substrate 15 is configured to include the prior path 15b in advance, the RF switch-matrix substrate 15 can switch the receiving path only with the prior-path switching signal of a few bits, thereby reducing a time required for switching the receiving path.

Although explained above is a case where the RF switch-matrix substrate 15 includes only one prior path, the RF switch-matrix substrate 15 can be configured to include a plurality of prior paths. In such case, it is configured to increase the number of bits of a prior-path switching signal correspondingly to the number of the prior paths.

As explained above, according to the embodiment, the event generating substrate 52 can freely switch, the receiving path (including a prior path) unit by unit of echo collection, by generating an event code at a breakpoint of a unit of echo collection during a scan. In other words, a receiving coil to receive an NMR signal can be freely switched unit by unit of echo collection, during a scan.

Usually, according to data collection by the MRI apparatus, the processing from excitation owing to a radio-frequency magnetic field to echo collection performed by the receiving coil is repeatedly performed line by line in the k-space, during one time of scanning. For this reason, for example, according to a sensitivity prescan in parallel imaging, after echo collection is repeatedly performed by the WB coil, through scanning for the first time, echo collection is repeatedly performed by the PA coil through scanning for the second time.

However, according to the embodiment, as described above, because the receiving coil can be switched unit by unit of echo collection during a scan, for example, the WB coil 13 and the PA coil 14 can be switched alternately unit by unit of echo collection during a sensitivity prescan. In other words, according to the embodiment, data for a WB-coil image and data for a PA-coil image can be alternately collected line by line in the k-space.

Accordingly, echo collection by the WB coil 13 and echo collection by the PA coil 14 can be collectively performed through one time of scanning in a sensitivity prescan, thereby reducing influence due to a motion of the subject. Furthermore, by switching the WB coil 13 and the PA coil 14 line by line in the k-space, a time gap between collection timings of the data for a WB-coil image and the data for a PA-coil image is to be small with respect to each line, misregistration between the both images can be reduced.

Figure 7:
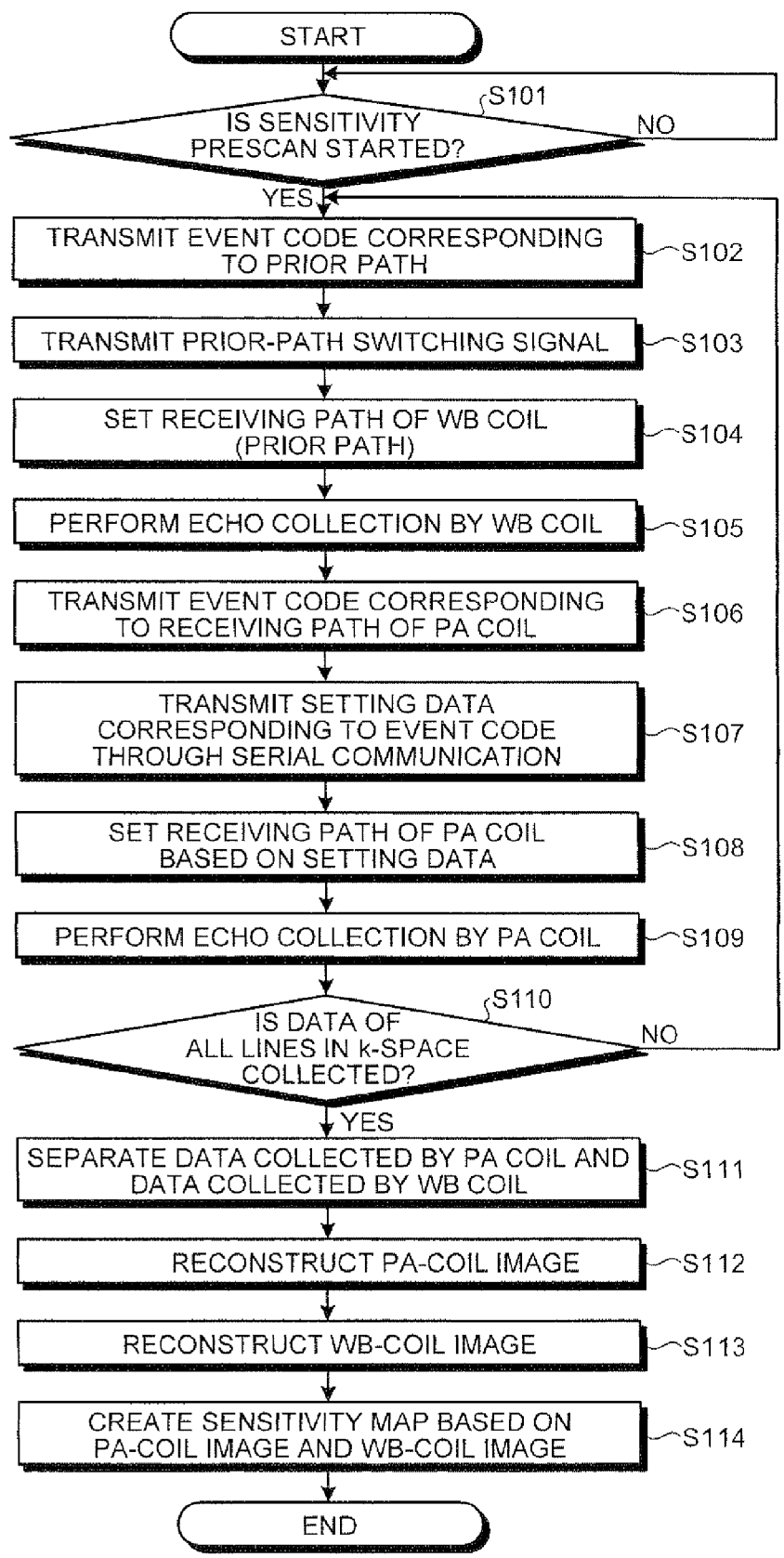
FIG. 7 is a flowchart for explaining a process procedure of a receiving-path switching method according to the embodiment.

A process procedure of the receiving-path switching method according to the embodiment is explained below. FIG. 7 is a flowchart for explaining the process procedure of the receiving-path switching method according to the embodiment. The following description explains switching of the receiving path when performing a sensitivity prescan of parallel imaging.

As shown in the figure, when after scanning conditions for a sensitivity prescan is set by the operator, the input unit 84 receives an instruction to start a scan (Yes at Step S101); under the control of the CPU substrate 51, at first, the WB coil 13 irradiates the subject P with a radio-frequency magnetic field, and then the event generating substrate 52 generates an event code corresponding to the prior path (the prior code), and transmits it to the gantry-unit control, substrate 53 (Step S102).

Subsequently, the gantry-unit control substrate 53 acquires setting data corresponding to the transmitted prior code from among the setting data stored by the storage unit 53a, and transmits the h switching signal set in the acquired setting data to the gantry unit 10 (Step S103).

When the prior-path switching signal is transmitted from, the gantry-unit control substrate 53, in the gantry unit 10, the RF switch-matrix substrate 15 sets the prior path (the receiving path connected to the WB coil 13) (Step S104). Accordingly, echo collection is performed by the WB coil 13 (Step S105).

Subsequently, under the control of the CPU substrate 51, the WB coil 13 irradiates the subject P with a radio-frequency magnetic field, and then the event generating substrate 52 generates an event code corresponding to the receiving path of the PA coil 14, and transmits it to the gantry-unit control substrate 53 (Step S106).

Subsequently, the gantry-unit control substrate 53 selects setting data corresponding to the transmitted event code from the setting data stored by the storage unit 53a, and transmits the selected setting data to the gantry unit 10 through serial communication (Step S107).

When the setting data is transmitted from the gantry-unit control substrate 53, in the gantry unit 10, the RF switch-matrix substrate 15 sets the receiving path of the PA coil 14 based on the transmitted setting data (Step S108). Accordingly, echo collection is performed by the PA coil 14 (Step S109). At that time, also the pin-diode drive substrate 16 switches ON/OFF of pin diodes based on the setting data.

In this way, the processing from Steps S102 to S109 described above is repeatedly executed until data of the all lines in the k-space is collected. When the data of the all lines in the k-space is collected, the image reconstructing unit 82 separates the data collected by the PA coil 14 and the data collected by the WB coil 13 (Step S111).

Subsequently, the image reconstructing unit 82 reconstructs a PA-coil image from the data collected by the PA coil 14 (Step S112), and furthermore, reconstructs a WB-coil image from the data collected by the WB coil 13 (Step S113).

The control unit 86 then estimates a sensitivity distribution of the PA coil 14 by comparing the reconstructed PA-coil image and the reconstructed WB-coil image, and creates a sensitivity map (Step S114).

In this way, according to the receiving-path switching method according to the embodiment, the WB coil 13 and the PA coil 14 are automatically switched unit by unit of echo collection (line by line in the k-space) in the sensitivity prescan of parallel imaging, consequently, the sensitivity map can be created through one time of scanning.

As described above, according to the embodiment, the event generating substrate 52 of the sequence control unit 50 generates an event code to make an instruction for switching the receiving path during a scan based on scanning conditions set in advance of the scan. When the event code is generated, the RF switch-matrix substrate 15 of the gantry unit 10 switches a receiving path that connects a receiving coil and a receiving circuit. Consequently, according to the embodiment, by enabling switching of the receiving path during a scan, misregistration among images can be reduced.

Moreover, according to the embodiment, the storage unit 53a of the gantry-unit control substrate 53 stores an event code and setting data that includes information required for setting a receiving path in an associated manner. Moreover, the gantry-unit control substrate 53 selects setting data corresponding to an event code generated by the event generating substrate 52 from among the setting data stored by the storage unit 53a. The RF switch-matrix substrate 15 of the gantry unit 10 then sets a receiving path by using the setting data selected by the gantry-unit control substrate 53. Accordingly, as setting data are preliminarily prepared as many as the number of receiving paths available to be set; even if the number of receiving coils is increased, the receiving path can be switched more flexibly in accordance with a type of the scanning method.

Furthermore, according to the embodiment, an event code generated by the event generating substrate 52 of the sequence control unit 50 includes a prior code that is generated with a certain timing. The RF switch-matrix substrate 15 of the gantry unit 10 preliminarily includes a receiving path that connects a receiving coil to be priorly used and the receiving circuit as the prior path; and when a prior code is generated by the event generating substrate 52, the RF switch-matrix substrate 15 switches the receiving path to the prior path. Accordingly, when performing a scan using a particular receiving coil priorly, the receiving path can be efficiently switched.

Moreover, according to the embodiment, the setting data stored by the storage unit 53a of the gantry-unit control substrate 53 includes pin-diode information for controlling operation of pin diodes included in the receiving coil. The pin-diode drive substrate 16 controls the operation of the pin diodes included in the receiving coil connected with the receiving path set by the RF switch-matrix substrate 15 of the gantry unit 10, based on the pin-diode information included in setting data corresponding to the event code generated by the event generating substrate 52 of the sequence control unit 50. Accordingly, decoupling between the coils can be automatically controlled in accordance with switching of the receiving path, so that an NMR signal can be detected highly precisely.

Furthermore, according to the embodiment, because the receiving coil can be switched unit by unit of echo collection during a scan, misregistration between a WB-coil image and a PA-coil image for creating a sensitivity map in parallel imaging can be reduced, and an unsatisfactory estimation of the sensitivity caused by the movement (movement of bowels, or respiratory motion) in more than a unit of echo collection can be improved.

Although according to the embodiment, assuming a case of performing parallel imaging, switching of the receiving path related to the PA coil and the WB coil is explained, the present invention is not limited to this, and can be similarly applied to a case of performing another scanning method or a case of using other kinds of receiving coils.

For example, when performing a scan while moving the top plate by using a PA coil that can cover the whole of a subject, it can be configured to switch a receiving path connected to a coil element or a group of coil elements positioned in the vicinity of the center of a scan area in accordance with the amount of movement of the top plate such that an NMR signal is to be received by the coil element or the group of coil elements.

Figure 8:
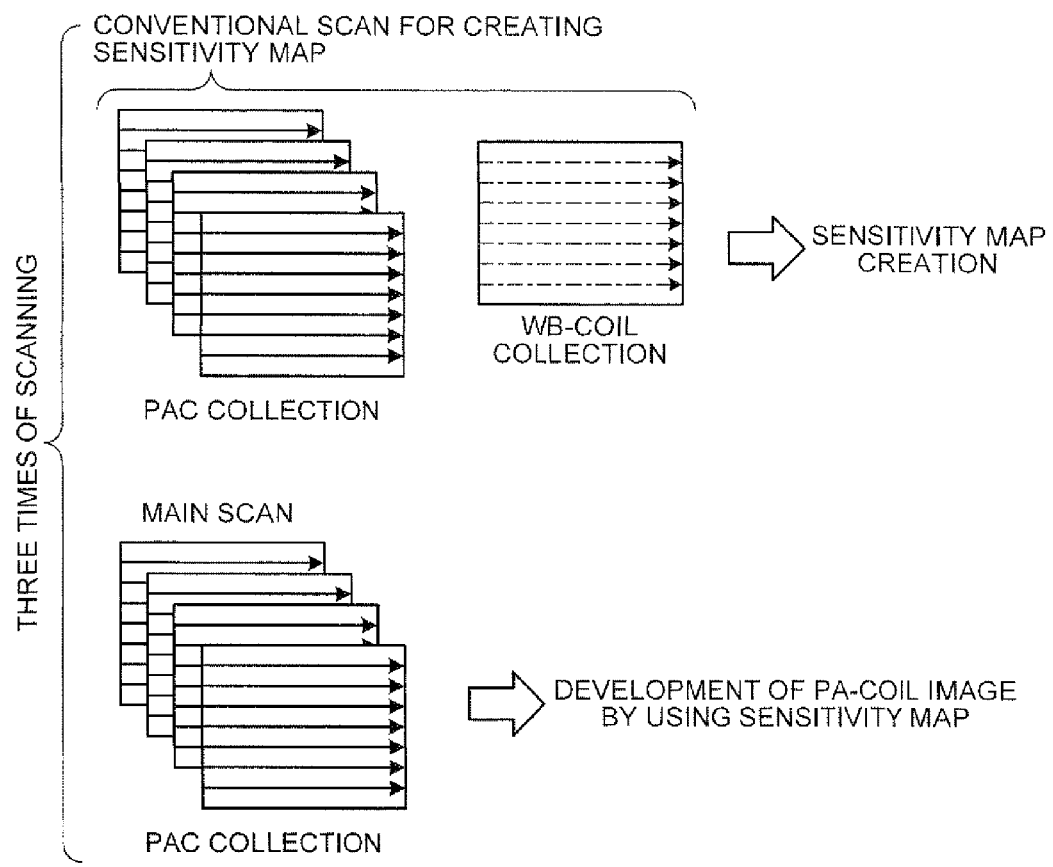
FIG. 8 is a schematic diagram for explaining parallel imaging performed by a conventional MRI apparatus.
Figure 9:
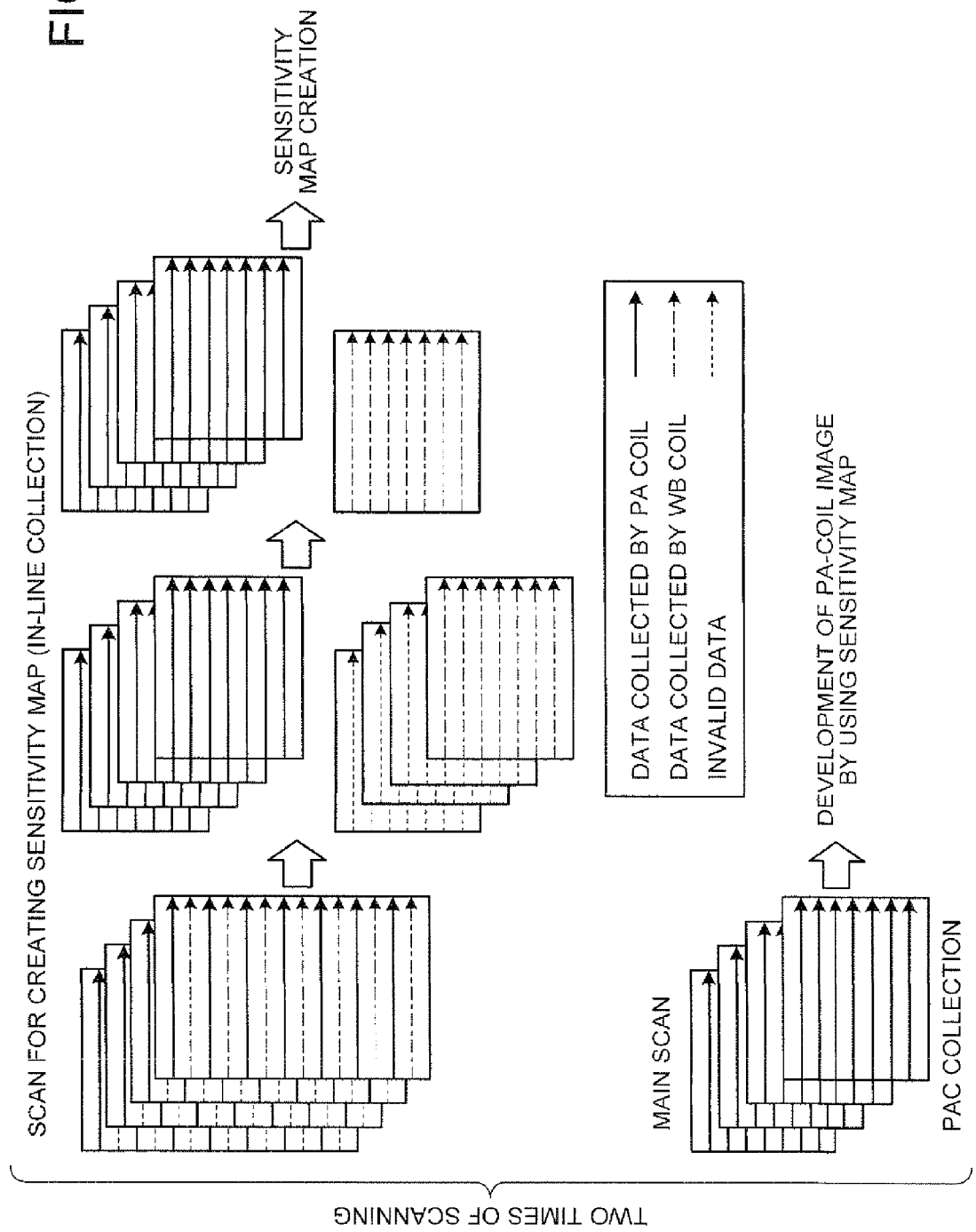
FIG. 9 is a schematic diagram for explaining parallel imaging performed by the MRI apparatus according to the embodiment.

Parallel imaging performed by the MRI apparatus 100 explained in the above embodiment is explained below. FIG. 8 is a schematic diagram for explaining parallel imaging performed by a conventional MRI apparatus. FIG. 9 is a schematic diagram for explaining parallel imaging performed by the MRI apparatus according to the embodiment.

When performing parallel imaging, as shown in FIG. 8, a conventional MRI apparatus performs a scan by using a PA coil (PAC collection) and a scan by using a WB coil (WB-coil collection), as a scan for creating a sensitivity map. Subsequently, the conventional MRI apparatus reconstructs a PA-coil image from data collected by the PA coil, and reconstructs a WB-coil image from data collected by the WB coil. The conventional MRI apparatus then creates a sensitivity map by using the reconstructed PA-coil image and the reconstructed WB-coil image. After that, the conventional MRI apparatus performs a scan by using the PA coil (PAC collection) as a main scan, and then develops a PA-coil image by using the sensitivity map. In other words, according to the parallel imaging performed by the conventional MRI apparatus, three times of scanning are performed in total.

By contrast, according to the MRI apparatus 100 according to the embodiment, when performing parallel imaging, as shown in FIG. 9, the MRI apparatus 100 collects data while switching the PA coil 14 and the WB coil 13 unit by unit of echo collection (in-line collection), as a scan for creating a sensitivity map. Accordingly, the storage unit 83 of the MRI apparatus 100 stores data collected by the PA coil 14 and data collected by the WB coil 13 alternately.

Subsequently, the MRI apparatus 100 separates the data collected by the PA coil 14 and the data collected by the WB coil 13. Accordingly, regarding the data collected by the PA coil 14, data is obtained with respect to each of the four receiving paths. Regarding the data collected by the WB coil 13, data of one receiving path is obtained.

The MRI apparatus 100 then reconstructs a PA-coil image from the data collected by the PA coil 14, and reconstructs a WB-coil image from the data collected by the WB coil 13. Furthermore, the MRI apparatus 100 creates a sensitivity map by comparing the reconstructed PA-coil image and the reconstructed WB-coil image.

After that, the MRI apparatus 100 performs a scan by using the PA coil 14 (PAC collection) as a main scan, and then develops a PA-coil image by using the sensitivity map created through the scan for creating a sensitivity map. In other words, according to the parallel imaging performed by the MRI apparatus 100, two times of scanning are performed in total.

In this way, the MRI apparatus 100 according to the embodiment can perform parallel imaging through two times of scanning, namely, a scan for creating a sensitivity map and a main scan. Moreover, according to the MRI apparatus 100, a scan for creating a sensitivity map can be performed through one time of scanning by switching the receiving path between the PA coil 14 and the WB coil 13 unit by unit of echo collection. Consequently, the MRI apparatus 100 can reduce misregistration among images caused by a motion of the subject between a scan and a scan.

The embodiment described above is explained in a case of using a WB coil connected to one receiving path in a scan for creating a sensitivity map, the present invention is not limited to this. For example, the present invention can be similarly applied to a case where a local coil (for example, a head coil or a spine coil) connected to a plurality of receiving paths is used, instead of the WB coil.

Figure 10:
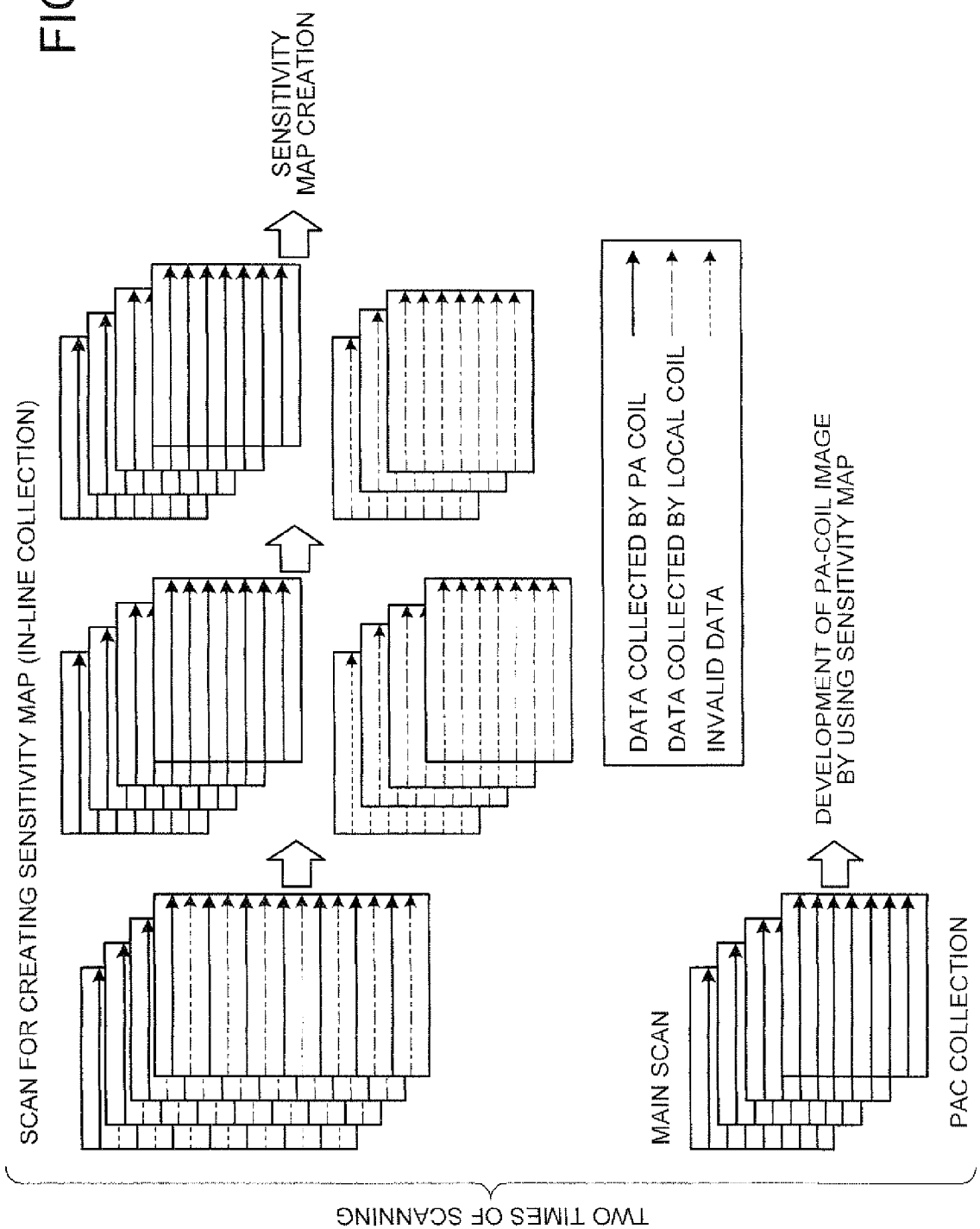
FIG. 10 is a schematic diagram for explaining a case of performing a scan for creating a sensitivity map by using a local coil connected to a plurality of receiving paths.

FIG. 10 is a schematic diagram for explaining a case of performing a scan for creating a sensitivity map by using a local coil connected to a plurality of receiving paths. FIG. 10 depicts a case where the number of receiving paths connected to the PA coil 14 is "four", and the number of receiving paths connected to the local coil is "three".

As shown in FIG. 10, in this case, the MRI apparatus 100 collects data as a scan for creating a sensitivity map while switching the PA coil 14 and the local coil unit by unit of echo collection (in-line collection). Accordingly, the storage unit 83 of the MRI apparatus 100 stores data collected by the PA coil 14 and data collected by the local coil alternately.

Subsequently, the MRI apparatus 100 separates the data collected by the PA coil 14 and the data collected by the local coil. Accordingly, regarding the data collected by the PA coil 14, data is obtained with respect to each of the four receiving paths. Regarding the data collected by the local coil, data is obtained with respect to each of the three receiving paths.

Furthermore, the MRI apparatus 100 reconstructs a PA-coil image from the data collected by the PA coil 14, and reconstructs a local-coil image from the data collected by the local, coil. The MRI apparatus 100 then creates a sensitivity map by comparing the reconstructed PA-coil image and the reconstructed local-coil image.

After that, the MRI apparatus 100 performs a scan by using the PA coil 14 (PAC collection) as a main scan, and then develops a PA-coil image by using the sensitivity map. In other words, also when performing parallel imaging by using the PA coil 14 and the local coil, two times of scanning are performed in total.

In this way, according to the MRI apparatus 100 according to the embodiment, even when performing a scan for creating a sensitivity map by using a local coil connected to a plurality of receiving paths, the scan for creating a sensitivity map can be performed through one time of scanning. Although explained above is a case where the number of the receiving paths connected to the PA coil 14 differs from the number of the receiving paths connected to the local coil, each of the number of the receiving paths can be the same.

Moreover, the embodiment described above is explained in a case of switching the receiving path during a scan for creating a sensitivity map, the present invention is not limited to this. For example, the receiving coil can be switched during a main scan.

Figure 11:
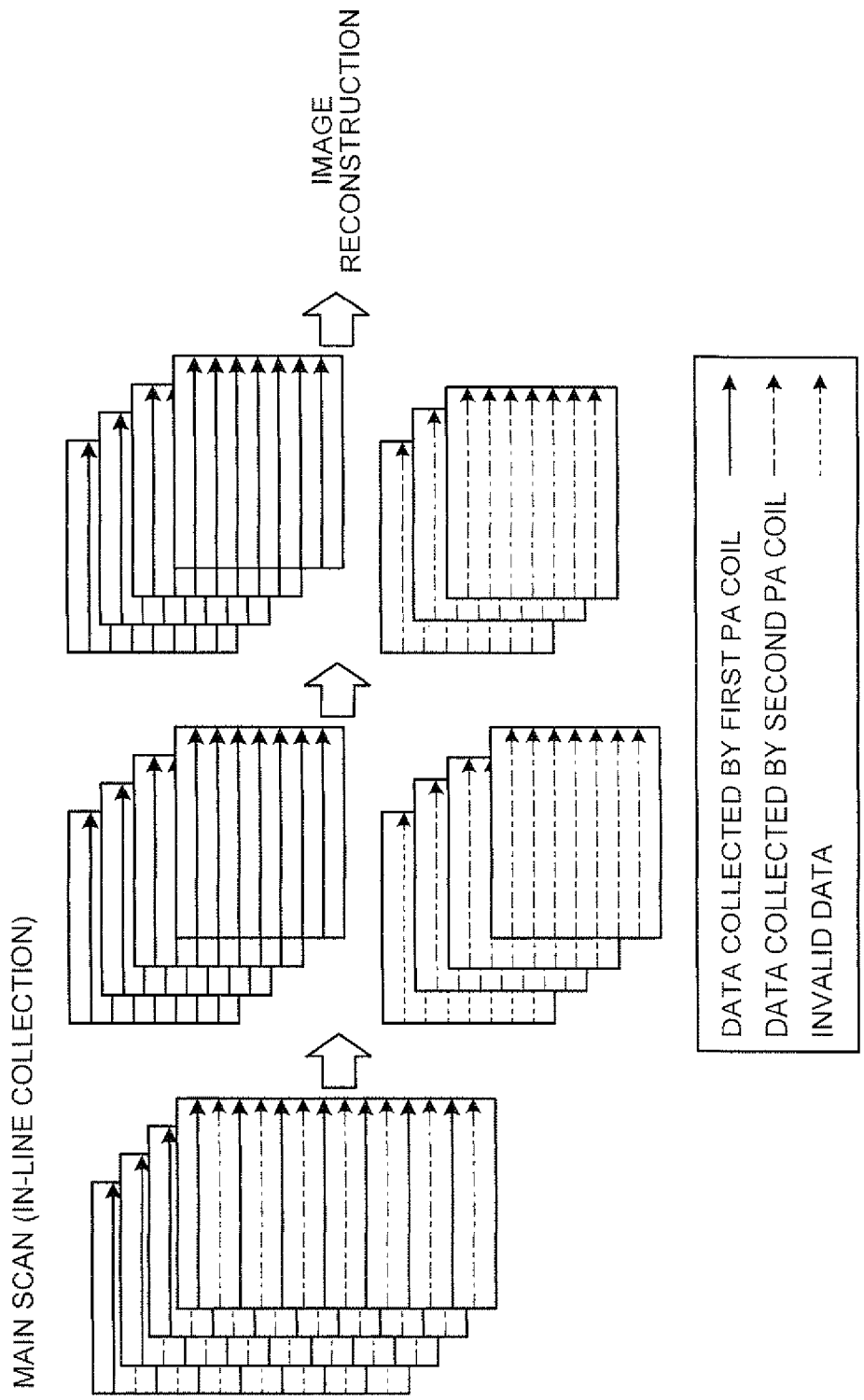
FIG. 11 is a schematic diagram for explaining a case of switching the receiving path during a main scan.

FIG. 11 is a schematic diagram for explaining a case of switching the receiving path during a main scan. FIG. 11 depicts a case of switching the receiving path between two PA coils, where the number of receiving paths connected to a first PA coil is "four", and the number of receiving paths connected to a second PA coil is "three".

As shown in FIG. 11, in this case, the MRI apparatus 100 collects data as a main scan while switching the first PA coil and the second PA coil unit by unit of echo collection. Accordingly, the storage unit 83 of the MRI apparatus 100 stores data collected by the first PA coil and data collected by the second PA coil alternately.

Subsequently, the MRI apparatus 100 separates the data collected by the first PA coil and the data collected by the second PA coil. Accordingly, regarding the data collected by the first PA coil, data is obtained with respect to each of the four receiving paths. Regarding the data collected by the second PA coil, data Is obtained with respect to each of the three receiving paths. The MRI apparatus 100 then reconstructs a PA-coil image from the data collected by the first PA coil, and reconstructs a PA-coil image from the data collected by the second PA coil.

In this way, the MRI apparatus 100 according to the embodiment can perform a main scan while switching the receiving path between a plurality of receiving coils. Accordingly, even when the number of receiving path included in the MRI apparatus 100 is limited, data can be collected more than the number of actual receiving paths by switching the receiving path between a plurality of receiving coils during one time of scanning. For example, according to the example shown in FIG. 11, even when the number of receiving paths included in the MRI apparatus 100 is "four", data of seven receiving paths can be collected by connecting the receiving path to the first PA coil and the second PA coil alternately.

In other words, according to the method, the number of receiving paths that the MRI apparatus 100 includes can be virtually increased. Accordingly, for example, when the MRI apparatus includes a function of receiving selection of a coil element to be used for a scan, the MRI apparatus can accept the number of coil elements more than the number of actual receiving paths from the operator.

Figure 12:
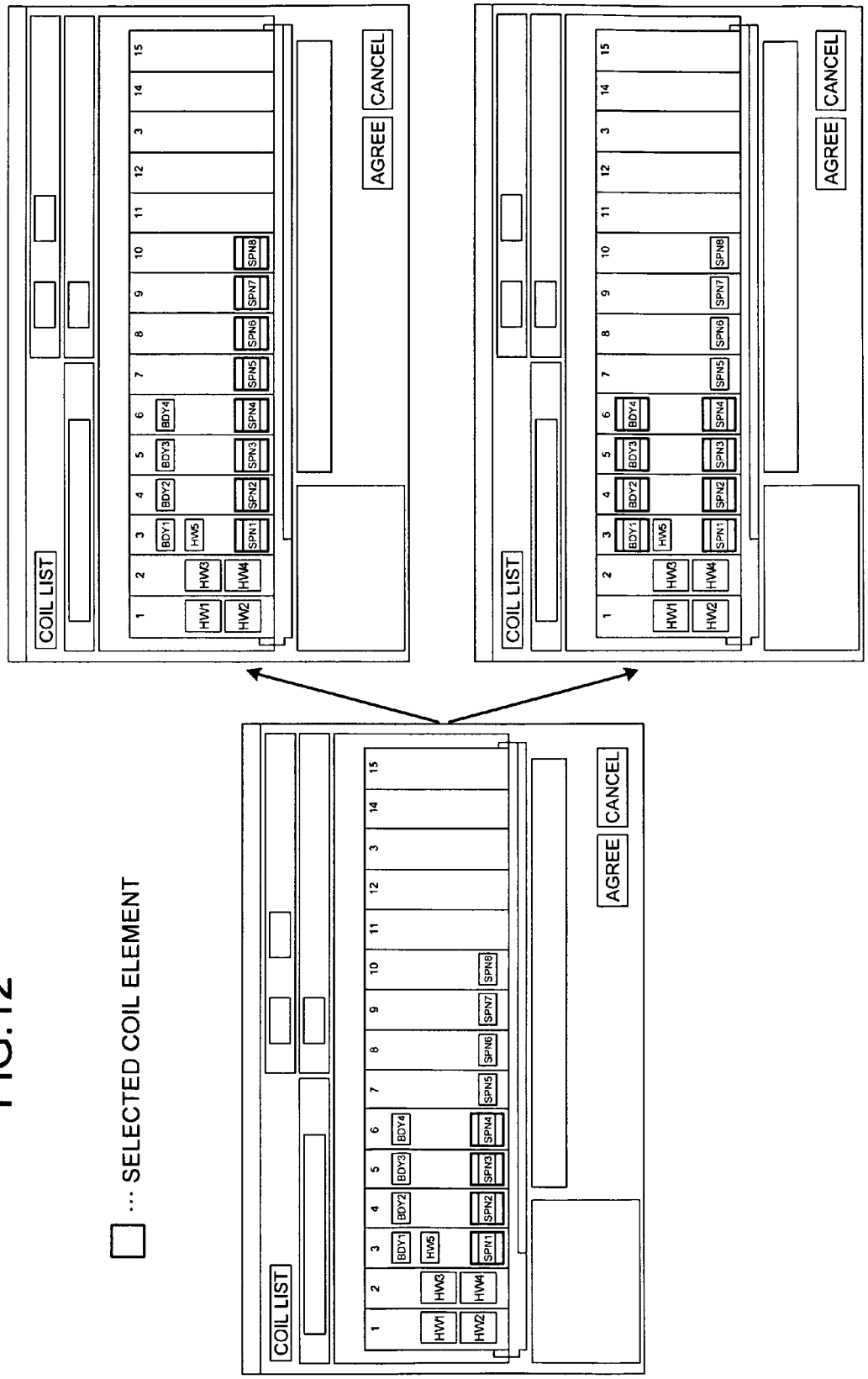
FIG. 12 is a schematic diagram of an example of a coil selection screen for receiving selection of a coil element.

FIG. 12 is a schematic diagram of an example of a coil selection screen for receiving selection of a coil element. For example, it is assumed that the number of receiving paths included in an MRI apparatus is "four". In such case, as shown in the left side of FIG. 12, the conventional MRI apparatus can accept only four coil elements at maximum from the operator. However, because the MRI apparatus 100 according to the embodiment can switch the receiving path between a plurality of coil elements, the MRI apparatus 100 can accept eight coil elements at maximum, as shown in the upper right or the lower right of FIG. 12.

As described above, the magnetic resonance imaging apparatus and the receiving-path switching method according to the embodiments of the present invention are useful when performing a scan using a plurality of kinds of receiving coils, and particularly suitable when there is a possibility of occurrence of misregistration between images each of which is reconstructed scan by scan.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic resonance imaging apparatus comprising:
a radio-frequency magnetic-field irradiating unit that irradiates a subject placed in a static magnetic field with a radio-frequency magnetic field;
a receiving coil that detects a nuclear magnetic resonance signal emitted from the subject caused by the radio-frequency magnetic field irradiated by the radio-frequency magnetic-field irradiating unit;
an image reconstructing unit that reconstructs an image from the nuclear magnetic resonance signal detected by the receiving coil;
an event generating unit that generates an event code to make an instruction for switching a receiving path that connects a receiving coil and a receiving circuit during a scan based on scanning conditions set in advance of the scan;
a receiving-path switching unit that switches a receiving path that connects the receiving coil and the receiving circuit when the event generated unit generates the event code.

2. The apparatus according to claim 1, wherein the event generating unit generates an event code to make an instruction for switching the receiving path unit by unit of echo collection.

3. The apparatus according to claim 1, further comprising:
a setting-data storage unit that stores setting data including information required for setting of a receiving path in a manner associated with an event code; and
a setting-data selecting unit that selects setting data corresponding to the event code generated by the event generating unit from the setting data stored by the setting-data storage unit, wherein the receiving-path switching unit sets the receiving path by using the setting data selected by the setting-data selecting unit.

4. The apparatus according to claim 2, further comprising:
a setting-data storage unit that stores setting data including information required for setting of a receiving path in a manner associated with an event code; and
a setting-data selecting unit that selects setting data corresponding to the event code generated by the event generating unit from the setting data stored by the setting-data storage unit, wherein the receiving-path switching unit sets the receiving path by using the setting data selected by the setting-data selecting unit.

5. The apparatus according to claim 3, further comprising a circuit-element control unit that controls operation of a circuit element that a receiving coil includes, wherein
the setting data stored by the setting-data storage unit includes circuit-element control information for controlling operation of a circuit element that a receiving coil includes, and
the circuit-element control unit that controls operation of a circuit element included in the receiving coil connected through the receiving path set by the receiving-path switching unit based on the circuit-element control information included in setting data corresponding to the event code generated by the event generating unit.

6. The apparatus according to claim 4, further comprising a circuit-element control unit that controls operation of a circuit element that a receiving coil includes, wherein
the setting data stored by the setting-data storage unit includes circuit-element control information for controlling operation of a circuit element that a receiving coil includes, and
the circuit-element control unit that controls operation of a circuit element included in the receiving coil connected through the receiving path set by the receiving-path switching unit based on the circuit-element control information included in setting data corresponding to the event code generated by the event generating unit.

7. The apparatus according to claim 1, wherein
the event code generated by the event generating unit includes a prior code that is generated with a predetermined timing, and
the receiving-path switching unit preliminarily includes as a prior path the receiving path to connect the receiving coil to be previously used and the receiving circuit, and switches the receiving path to the prior path when the event generation unit generates the prior code.

8. The apparatus according to claim 2, wherein
the event code generated by the event generating unit includes a prior code that is generated with a predetermined timing, and
the receiving-path switching unit preliminarily includes as a prior path the receiving path to connect the receiving coil to be previously used and the receiving circuit, and switches the receiving path to the prior path when the event generation unit generates the prior code.

9. The apparatus according to claim 3, wherein
the event code generated by the event generating unit includes a prior code that is generated with a predetermined timing, and
the receiving-path switching unit preliminarily includes as a prior path the receiving path to connect the receiving coil to be previously used and the receiving circuit, and switches the receiving path to the prior path when the event generation unit generates the prior code.

10. The apparatus according to claim 4, wherein
the event code generated by the event generating unit includes a prior code that is generated with a predetermined timing, and
the receiving-path switching unit preliminarily includes as a prior path the receiving path to connect the receiving coil to be previously used and the receiving circuit, and switches the receiving path to the prior path when the event generation unit generates the prior code.

11. The apparatus according to claim 5 wherein
the event code generated by the event generating unit includes a prior code that is generated with a predetermined timing, and
the receiving-path switching unit preliminarily includes as a prior path the receiving path to connect the receiving coil to be previously used and the receiving circuit, and switches the receiving path to the prior path when the event generation unit generates the prior code.

12. The apparatus according to claim 6, wherein
the event code generated by the event generating unit includes a prior code that is generated with a predetermined timing, and
the receiving-path switching unit preliminarily includes as a prior path the receiving path to connect the receiving coil to be previously used and the receiving circuit, and switches the receiving path to the prior path when the event generation unit generates the prior code.

13. A magnetic resonance imaging apparatus comprising:
a radio-frequency magnetic-field irradiating unit that irradiates a subject placed in a static magnetic field with a radio-frequency magnetic field;

a plurality of receiving coils that detects a nuclear magnetic resonance signal emitted from the subject caused by the radio-frequency magnetic field irradiated by the radio-frequency magnetic-field irradiating unit;

an image reconstructing unit that reconstructs an image from the nuclear magnetic resonance signal detected by the receiving coils; and a receiving-path switching unit that switches receiving paths that connect the receiving coils and a receiving circuit during a scan based on scanning conditions set in advance of the scan.

14. The apparatus according to claim 13, wherein
the receiving coils include a phased array coil that includes a plurality of coil elements, and a whole body coil, and
the receiving-path switching unit switches the receiving paths during a sensitivity prescan through which created is a sensitivity map indicating a sensitivity distribution of each coil element, by comparing an image obtained by the phased array coil and an image obtained by the whole body coil.

* * * * *